United States Patent

[11] 3,634,775

[72] Inventors Wolfgang Ulmer;
Hermann Rausch, both of Munich, Germany

[21] Appl. No. 82,226
[22] Filed Oct. 19, 1970
[45] Patented Jan. 11, 1972
[73] Assignee Siemens Aktiengesellschaft
[32] Priority Sept. 20, 1967
[33] Germany
[31] P 15 37 690.6
Continuation of application Ser. No. 761,228, Sept. 30, 1968. This application Oct. 19, 1970, Ser. No. 82,226

[54] TRANSISTORIZED BROADBAND AMPLIFIERS WITH GAIN CONTROL
9 Claims, 5 Drawing Figs.

[52] U.S. Cl. .......... 330/29, 330/145
[51] Int. Cl. .......... H03g 3/30
[50] Field of Search .......... 330/29, 21, 144, 145; 325/319, 414

[56] References Cited
UNITED STATES PATENTS
3,150,326 9/1964 Witt .......... 330/29 X
OTHER REFERENCES
Bettinger, " Microwave Radio System for Multichannel Telephony And Television in the 6-gigaHertz Ranges Part 3– Wide-Band Intermediate-Frequency Amplifiers" Electrical Communication, Vol. 40, No. 2, 1965 pp. 192– 199

*Primary Examiner*—Roy Lake
*Assistant Examiner*—James B. Mullins
*Attorney*—Hill, Sherman, Meroni, Gross & Simpson

ABSTRACT: A transistorized broadband amplifier having a gain control which includes attenuation elements coupled between transistor amplifier stages and which has a diode coupled from a point intermediate the attenuation elements to circuit ground. The output signal is coupled through the diode and to the midpoint of the attenuation elements thereby providing improved attenuation without introducing distortion or noise into the transistor amplifier circuits.

INVENTORS
*Wolfgang Ulmer*
*Hermann Rausch*

BY Hill, Sherman, Meroni, Gross & Simpson ATTORNEYS

PATENTED JAN 11 1972 3,634,775

SHEET 2 OF 4

INVENTORS
Wolfgang Ulmer
Hermann Rausch

BY Hill, Sherman, Meroni, Gross & Simpson ATTORNEYS

INVENTORS
*Wolfgang Ulmer*
*Hermann Rausch*

BY Hill, Sherman, Meroni, Gross & Simpson

ATTORNEYS

PATENTED JAN 11 1972 3,634,775

INVENTORS
Wolfgang Ulmer
Hermann Rausch

BY Hill, Sherman, Meroni, Gross & Simpson
ATTORNEYS

TRANSISTORIZED BROADBAND AMPLIFIERS WITH GAIN CONTROL

CROSS-REFERENCES TO RELATED APPLICATIONS

This application is a continuation of application Ser. No. 761,228, filed Sept. 20, 1968.

BACKGROUND OF THE INVENTION

Field of the Invention

The field of art to which this invention pertains is broadband amplifier circuits having gain control and particular circuits having means for providing attenuation without distortion.

SUMMARY OF THE INVENTION

It is a principal feature of the present invention to provide a broadband amplifier having means for introducing attenuation without distortion.

It is another feature of the present invention to provide a transistorized amplifier having attenuation elements connected in series between successive amplifier stages.

It is an important object of the present invention to provide an improved broadband amplifier having means for regulating the level of the signal while maintaining the linearity of the response characteristic of the amplifier.

Another object of the present invention is to provide a transistorized broadband amplifier and a pair of attenuation elements connected in series between successive transistors, and having a diode conducting from the midpoint between the transistors to circuit ground.

It is a further object of this invention to provide an amplifier attenuation network as described above wherein a pair of crystal diodes are provided in antiparallel connection.

It is also an object of this invention to provide a broadband attenuation network as described above wherein a pair of diodes are coupled in series opposition to conduct from the midpoint attenuation elements to circuit ground and wherein the output signal is coupled to one of the diodes.

These and other objects, features and advantages of the present invention will be understood in greater detail from the following description and associated drawings wherein reference numerals are utilized to illustrate an illustrative embodiment.

DESCRIPTION OF THE PREFERRED EMBODIMENT

Figure 1:
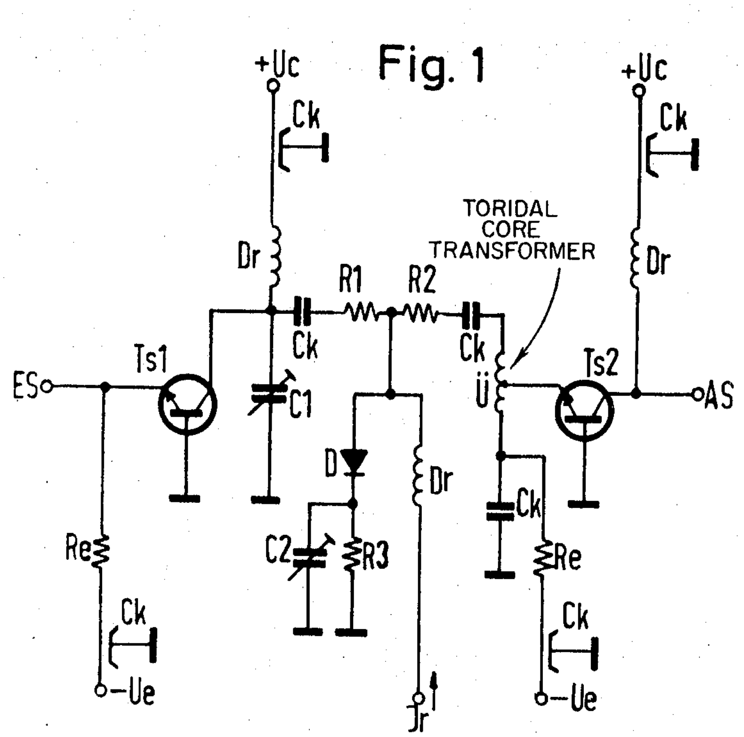
FIG. 1 is a schematic of an attenuation or regulation network in accordance with the invention showing a pair of transistors and the intermediate-coupled attenuation elements together with the diode regulation circuit.

The invention relates to a transistorized broadband amplifier having gain control means including attenuation networks coupled between two transistors. The attenuation networks have at least one crystal diode, and the current therein is controlled in response to a regulation requirement and preferably using additional amplification stages placed in circuit between the regulating stages. These amplification stages may be frequency selective as required.

Automatic gain must be provided particularly in directional radio systems, having a very broad control range and wherein other requirements, for example with respect to the variation of the transfer characteristic, are extremely stringent. Intermediate frequency amplifiers for such systems have, for example, broadbands of about 100 MHz. in a middle frequency of about 70 MHz. and must meet in this large frequency range the above-mentioned stringent requirements with respect to minimal linearity distortions. Furthermore, these properties may not be substantially varied even within a very large range of regulation of, for example, 50 to 80 db.

Automatic gain control of a regulating stage should be as large as possible, so that the prescribed control range can be covered with a minimum number of regulating stages. The remaining stages of the amplifier, in case of necessity, can then be placed in circuit between the regulating stages.

The maximum attenuation of a regulating stage cannot be increased arbitrarily due to the noise effects of the amplifier; for example, a magnitude of 9 db. generally may not be exceeded. If a larger automatic gain control of a stage is necessary, this stage must also be able to amplify. This has namely the advantage that the number of necessary amplification stages can be reduced, since these regulating stages then can contribute to the overall amplification of the amplifier. However, considerable difficulties are encountered in the dimensioning of such stages to maximize amplification if, as mentioned above:

a. the attenuation distortions must be kept at a minimum at least over a large portion of the range of regulation in the desired frequency band and, b. if over the entire range of regulation a minimum number of nonlinear distortions of the signal are to occur, for example, distortion products and/or the conversion of amplitude modulation into phase modulation (AM–PM conversion) in frequency-modulated signals.

German Pat. Display Copy 197,932 discloses an amplifier wherein the above features are desired.

Another patent of interest is German Pat. Display Copy 1,179,600. In this patent the regulating stages operate as band-pass filters and are also constructed to amplify. In such a regulating stage the range of regulation consists of a portion which contributes actively to the amplification and a portion which attenuates.

According to the present invention, these amplifiers are improved in a transistorized broadband amplifier having a gain control consisting of attenuation networks placed in circuit between two amplifier transistors which transistors are operated in common-base connection and which contain at least one crystal diode having a current therein which is controlled in response to a regulation criterion. Additional, if necessary, frequency-selective, amplification stages are placed between the regulating stages. The attenuation network includes resistors connected in series with the output of the preceding transistors. A crystal diode is connected from these transistors toward circuit ground. These resistors are coupled to a transformer having a secondary coil which is connected to the input of the following transistor.

An advantageous further development consists in placing two, instead of one, crystal diodes in antiparallel connection for alternating currents. A circuit wherein two crystal diodes are in series opposition connection has the same advantage, namely the practically perfect suppression of second harmonics of the signal current.

To obtain minimum attenuation distortion, it is of advantage to compensate for the lead inductance of the crystal diode. This can be done by the series connection of the diode with a parallel adjustable capacitance. The shunt capacitance at the input of the attenuation network is advantageously adjusted to assure a minimum number of attenuation distortions as seen at the collector of the transistor preceding the regulation network. If necessary an adjustable capacitance may be added to the network.

Of the two series resistances in the regulation network the second is advantageously selected such that a predetermined maximum value of the attenuation of the regulating stage is attained, while the first series resistance is so selected that the attenuation distortions are minimum over the entire range of regulation. Moreover, it has been demonstrated as particularly advantageous if the transformer is constructed as an economy transformer having a large principal inductance with simultaneously small leakage inductance. A toroidal core transformer serves this purpose.

The attenuation network in accordance with the invention has been demonstrated as particularly useful in connection with amplification stages connected before or after this network. The coupling networks of these amplification stages should contain a transformer and an attenuation series-resonant circuit parallel connected on the primary or secondary side of the transformer, which together with the stray capacitances of the circuit and the leakage inductances of the transformer, as well as with the input resistance of the following transistor, forms a filter which provides a flat transmission characteristic. To this end, elements L, R and C of the series-resonant circuit, upon switching on the primary side of the transformer with the translation ratio $\ddot{u}$ in response to elements L2, R2 and W2 (resonance frequency) of the parallel-resonant circuit formed at the leakage inductances and capacitances of the circuit, are advantageously selected as follows:

$$R=0.9\cdot W2\cdot L2\cdot \ddot{u}^2$$
$$L=0.3\cdot L2\cdot \ddot{u}^2$$
$$C=1/0.9\cdot W2R2\ddot{u}^2$$

With the application of a stepwise regulation, it has been demonstrated as very advantageous to first control the regulating stages closest to the input of the amplifier, starting from maximum amplification of the amplifier to approximately the value: amplification = attenuation = 0, then in the same manner the following regulating stages and subsequently all regulating stages jointly up to maximum amplification.

The solution according to the invention and its advantages are described in detail with reference to the circuit examples illustrated in FIGS. 1 to 5.

FIG. 1 shows a regulating network in accordance with the invention which is normally disposed in the arrangement of a larger intermediate-frequency amplifier. At the input is a transistor T*s*l connected in common-base circuit, to which is fed an input signal ES at the emitter. A voltage U*e* is coupled to the emitter of transistor T*s*l via a filter section consisting of C*k* and R*e*. A DC voltage U*c* is connected to the collector through inductor D*r*. Parallel to the collector-to-base section of the transistor T*s*l is a capacitor Cl to balance the input shunt capacitance of the coupling network. Two series attenuation resistors R1 and R2 are connected from the collector through capacitor C*k* and a diode D is coupled from intermediate the two resistors to circuit ground through an RC combination consisting of the parallel connection of capacitor C2 and resistor R3.

The RC combination can also be bridged additionally for direct current by a radiofrequency choke.

The circuit signal output is coupled to a point between the two resistors R1 and R2 via an inductor D*r* in the form of a regulating current I*r*. The output of the real attenuation network is DC blocked by means of coupling capacitor C*k*, and the signal reaches the primary side transformer $\ddot{u}$ via capacitor C*k*. Transformer $\ddot{u}$ triggers the emitter of transistor T*s*2 which is likewise operated in a common-base connection. DC is supplied to the emitter of transistor T*s*2 through a resistor R*e*. Resistor R*e* is connected in parallel with a capacitor C*k*. The collector of transistor T*s*2 is supplied with DC through an inductor D*r*. The DC source is bridged by a capacitor C*k*. An output signal appears at the collector of transistor T*s*2. All indicated coupling capacitors and bypass capacitors, called C*k*, perform only the functions already indicated and should have substantially zero reactance at frequencies being generated by the amplifier. The inductors, on the other hand, as is well known, have a large reactance at the generated frequencies. Resistors R*e* need not be equal in value, but since they serve the same purpose, they carry the same reference symbol.

Transformer $\ddot{u}$ should have for the transmission of a large frequency band, a maximum large main inductance and a minimum small leakage inductance, which is attainable in the simplest way by constructing the same as a toroidal core transformer. It causes, in accordance with its translation ratio, an amplification of the regulating stage, if the regulating diode D is in a high-resistance state, that is to say, if the regulating current I*r* equals zero. Attenuation distortions of the regulating stage can in this regulating state be reduced to a minimum by means of a capacitor C1. The remaining circuit elements are best selected as follows: C2 is so dimensioned that with maximum regulating current it compensates for the lead inductance of the regulating diode. If capacitor C2 is so adjusted that maximum attenuation distortions of the entire network occur, then practically speaking, also the above compensation arises.

Resistor R1 is so dimensioned that the attenuation distortions in the entire regulating range are at a minimum. The insertion of the resistor R1 into the circuit in accordance with the present invention is extremely important, since in this way the input resistance of transistor T*s*l connected ahead of the attenuation network remains largely constant over the entire regulating range of the stage. Because of the reflected capacities which are particularly high in transistors, fluctuations in the collector resistance are noticeable as variations in the input resistance. It has been demonstrated that without resistor R1 the regulating stage of this transistor varies approximately by the factor 10, while with resistor R1 it varies only by the factor 2. Since these variations of the collector resistance are translated in corresponding variations of the input resistance, attenuation distortions are thus effected over the regulating range in the amplifier stage which immediately precedes the regulating stage. The small variation of the collector resistance attained through the insertion of the resistance R1 therefore results in slight variations of the emitter resistance which are of no consequence.

Figure 2:
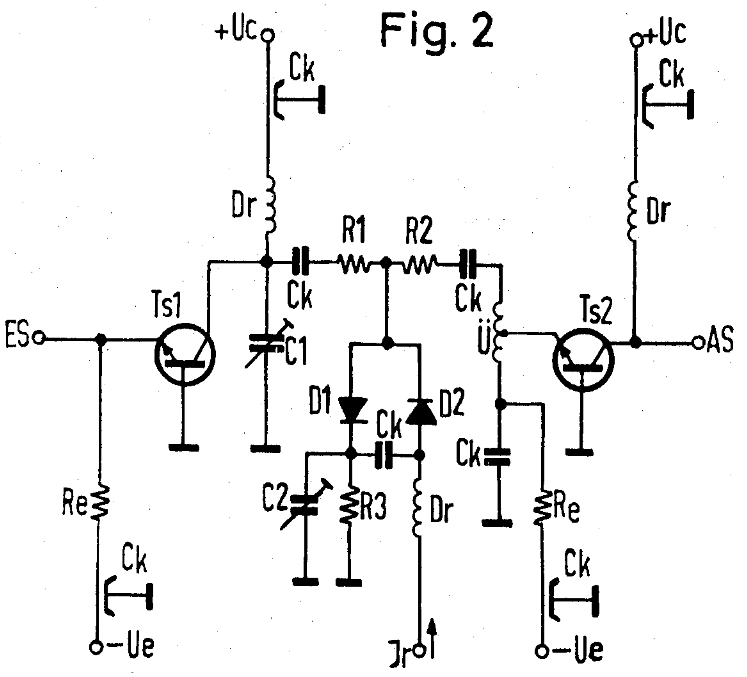
FIG. 2 is a schematic of an embodiment using a pair of diodes coupled in antiparallel relation in the regulation circuit.

An advantageous development of the circuit arrangement illustrated in FIG. 1 is shown in FIG. 2. In this circuit arrangement, two regulating diodes for alternating current are connected in antiparallel relation. The regulating current, however, is supplied in series to these two diodes for which an additional blocking capacitor C*k* is provided. All remaining circuit elements have remained unchanged as compared to FIG. 1. By using two diodes it has been found that practically no second harmonic of the signal current is generated, since both half-waves of the alternating signal are attenuated in a like manner. The parallel diode connection has the additional advantage that the resistances of the regulating diodes, due to their parallel connection, can be twice as large for the same maximum attenuation in the circuit arrangement of FIG. 1.

Figure 3:
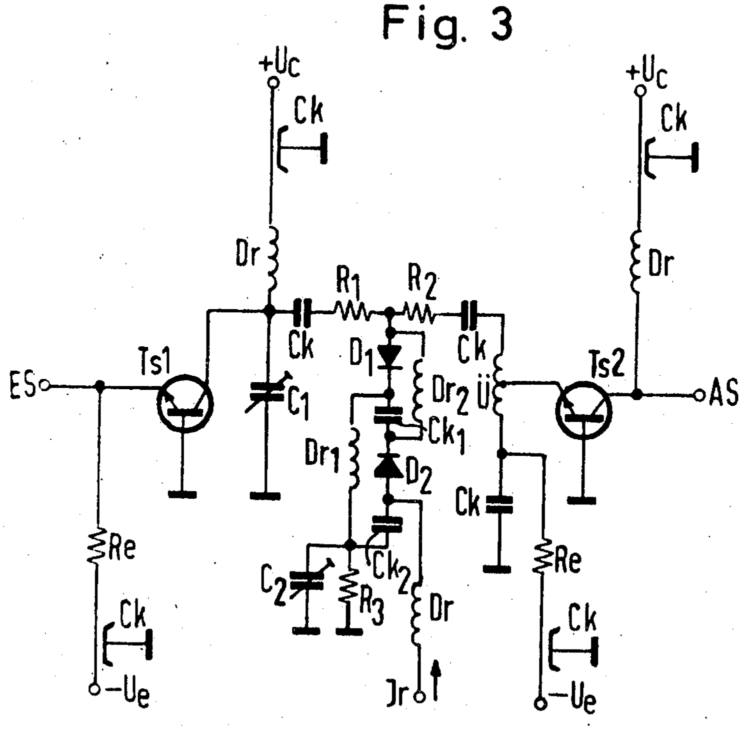
FIG. 3 is an embodiment of the invention showing a pair of diodes coupled in series opposition in the regulation circuit.

It has been demonstrated that also a circuit arrangement such as illustrated in FIG. 3 can be advantageous. In this circuit arrangement two regulating diodes are utilized. However, diodes D1 and D2 are connected in series opposition. In this manner the second harmonic of the signal current is suppressed. For regulating current I*r*, both diodes with like polarity are connected in series, for which reactors D*r*l and D*r*2 and blocking capacitors C*k*1 or C*k*2 are utilized. This circuit variation has the advantage that the diode capacitor which for small regulating currents appears as an interference, is split into two equal parts by the series connection of the diode.

If, finally, in the three illustrated circuit variations particularly "passive" diodes are utilized, a particularly small conversion of amplitude modulation into phase modulation can be attained.

In accordance with the present invention, the regulating stages described above are particularly advantageous in amplifiers wherein a simultaneous regulation of all regulating stages is possible with a common regulating current. To this end, the diodes of all regulating networks receive a control current delivered by a variable-gain amplifier.

To keep the noise factor of such an amplifier at a minimum a stepwise regulation is provided. It is advantageous to control separately at least the regulating stage closest to the input from the maximum attenuation e.g., 9 db.) up to an attenuation of approximately 0 db., since the attenuation distortions of the regulating stages in the range from 0 db. to the maximum amplification of the regulating stage for directional radio systems having a large number of channels (e.g.,1,800 channels) can perhaps be too great.

In this case, therefore, starting from the minimum amplification, first the regulating stage closest to the input is controlled in the indicated manner and the following regulating stages, from their maximum attenuation up to about 0 db. and subsequently all regulating stages together from an attenuation of 0 db. up to their maximum amplification.

Figure 4:
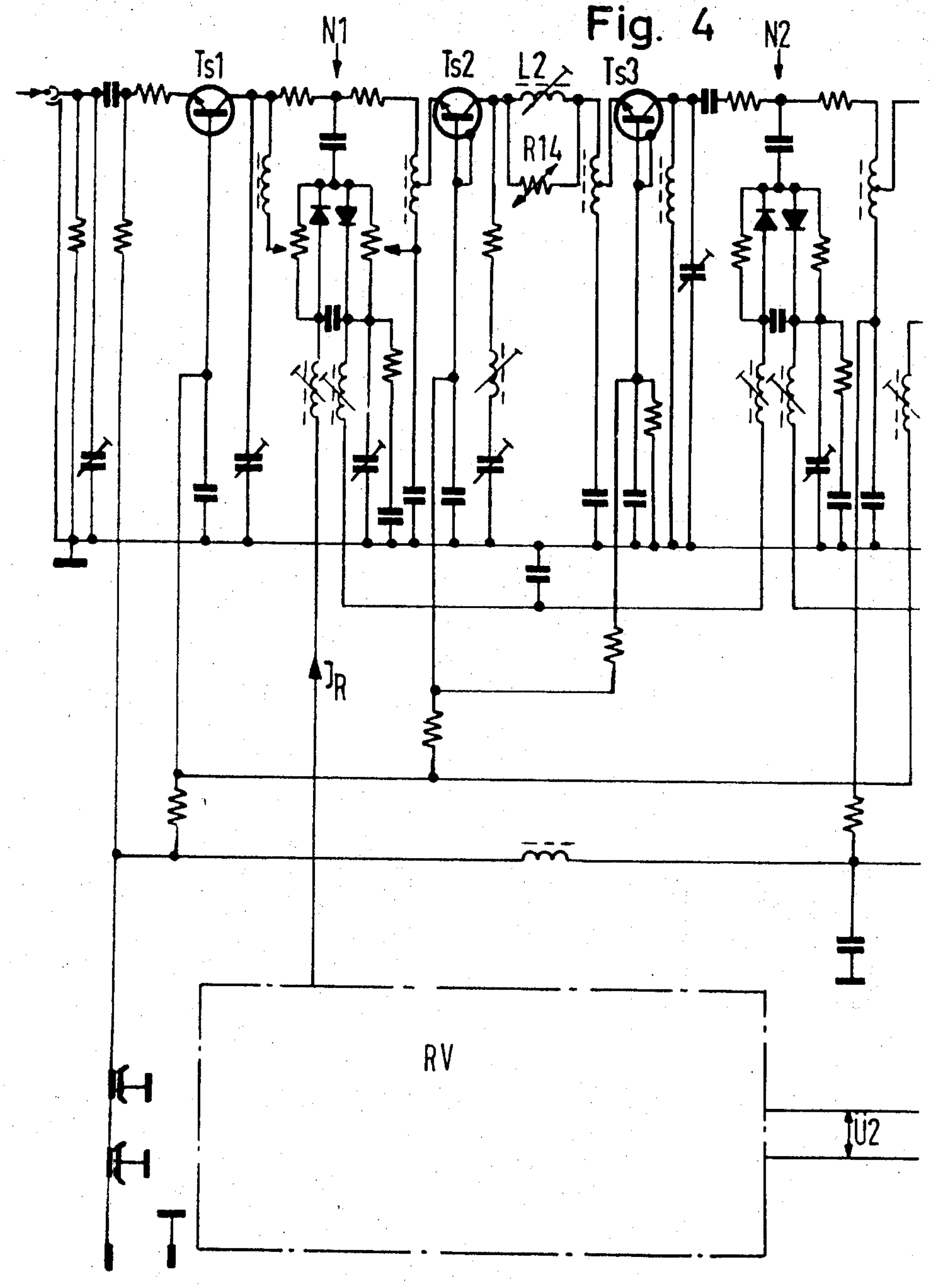
FIG. 4 is a typical schematic of a large intermediate frequency amplifier utilizing the regulation and attenuation features of the present invention.

FIG. 4 shows the entire circuit diagram of an embodiment for a large amplifier in accordance with the present invention, wherein three regulating networks N1, N2 and N3 are available, each containing two diodes in antiparallel connection in accordance with the embodiment for the control circuit illustrated in FIG. 2. The regulating stages in this embodiment have an automatic gain control of approximately 18 db., namely an attenuation of 9 db. and an amplification of 9 db.

The amplifier stages between the regulating stages amplify approximately 9 db., so that the overall amplification with the application of seven transistors as here illustrated amounts to approximately 54 db. However, the seventh transistor is provided only to adjust the output of the amplifier to the characteristic impedance of a low-resistance cable and does not contribute to the amplification. If in accordance with previously known proposals, only regulating stages without amplification were to be used with maximum attenuation of 9 db., six regulating stages and six amplifier stages for the same automatic gain control and the same amplification as in the amplifier here shown would be necessary. Thus, a total of 13 transistors would be necessary in this case.

As already mentioned when discussing FIG. 1, as a result of the regulation, only small but nevertheless still ascertainable variations of the input resistance of the transistor preceding the regulating network occur. It has been demonstrated that with the application of the coupling networks for the amplification stages illustrated in FIG. 4, for example for the coupling network between transistors T*s*6 and T*s*7, very small attenuation distortions occur as a result of these variations of the input resistance of the transistor. This coupling network is described in German Display Pat. No. 1,197,932 and consists substantially of a series-resonant circuit comprised, for example, of resistance R50, inductance L9 and capacitor C42 and a parallel-resonant circuit comprised substantially of the following elements: the collector capacitor of transistor T*s*6, the leakage inductance of transformer *ü* and the input resistance of the following transistor T*s*7. These two circuits form together a filter having a transfer characteristic which upon tuning of the series-resonant circuit, preferably to a frequency in the vicinity of half the maximal useful frequency of the amplifier, becomes flat. The series-resonant circuit can be connected on either side of transformer *ü*. However, if it is connected on the primary side, as illustrated, the following circuit values have been proven to be advantageous:

$$R=0.9\cdot W2\cdot L2\cdot ü$$
$$L=0.3\cdot L2\cdot ü^2$$
$$C=1/0.9\cdot W2\cdot R2\cdot ü^2$$

*L*, *R* and *C* are the components of the series-resonant circuit corresponding to elements L9, R50, and C42, while the values *L2* and *R2* are controlled variables, mainly the input impedance of the transistor, the leakage capacitance of the transformer and the stray capacitances of the circuit. *W* is the resonant frequency of the parallel resonant circuit.

An amplifier which is thus composed, as particularly illustrated in FIG. 4, meets to a large extent all the requirements made of the amplifier referred to above.

The parallel connections of the coupling networks described above, for example L2, R14, L5, R24, L10 and R52 provide temperature compensation, as the resistances provided with a double arrow are temperature-sensitive resistances, each being bridged by an adjustable inductance (e.g., L10).

Figure 5:
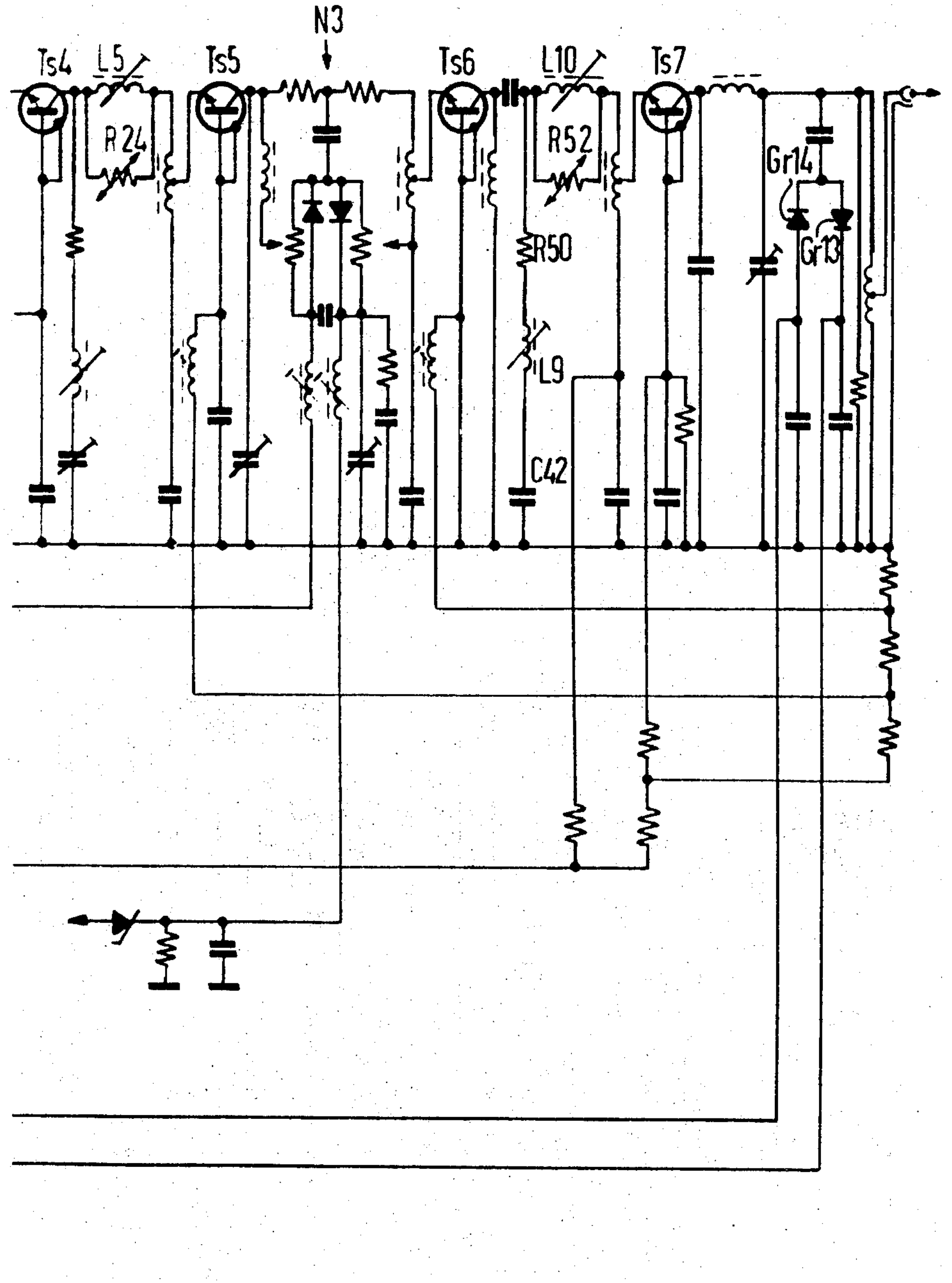
FIG. 5 is a continuation of the right-hand portion of FIG. 4.

The two diodes G*r*14 and G*r*13 disposed at the output of the circuit serve to rectify the signal to gain the regulation criterion. This voltage is coupled to a variable-gain amplifier RV having a plurality of transistors, and the regulation criterion is amplified in the form of a regulation current I*r*. The regulation current then is coupled to all the diodes in series and is finally connected to circuit ground. The importance of all other elements of the circuit illustrated in FIG. 5 is either generally known or has been explained above.

We claim as our invention:

1. A broadband amplifier comprising: first and second transistors each having base, emitter and collector connections, means for coupling an input signal to said first transistor, and an output signal being present at said second transistor, first and second attenuation elements being coupled in a series path between said first and second transistors, means for coupling a portion of an output signal to a circuit point intermediate said first and second attenuation elements to provide amplification control, a diode coupled from said circuit point to circuit ground, a transformer being provided, and said first and second attenuation elements being coupled to the primary of said transformer with the secondary thereof being coupled to the input of said second transistor.

2. A broadband amplifier in accordance with claim 1 wherein a second diode is coupled in antiparallel relation with said first-named diode.

3. A broadband amplifier in accordance with claim 1 wherein a second diode is coupled in series opposition with said first-named diode.

4. A broadband amplifier in accordance with claim 1 wherein a parallel capacitor and resistor are provided and wherein said diode is coupled to circuit ground through said parallel capacitor and resistor circuit and wherein said capacitor has a value to compensate for the lead inductance of said diode when the network is set at maximum attenuation.

5. An amplifier in accordance with claim 4 wherein said capacitor is adjusted for minimum attenuation distortion and wherein an additional adjustable trimmer capacitor is provided in parallel with the collector of said first transistor.

6. An amplifier in accordance with claim 1 wherein said transformer is a toroidal core transformer.

7. An amplifier in accordance with claim 1 wherein a series-resonant circuit is coupled to said transformer which, together with the stray capacitances and the stray inductances of the circuit, as well as with the input resistance of the following transistor, forms a filter which provides substantially flat transformer response.

8. An amplifier in accordance with claim 7 wherein the inductance *L*, resistance *R*, and capacitance *C* of the series-resonant circuit are selected as follows:

$$R=0.9\cdot W2\cdot L2\cdot ü^2$$
$$L=0.3\cdot L2\cdot ü^2$$
$$C=1/0.9\cdot W2\cdot R2\cdot ü^2$$

wherein the translation ratio of the transformer is $ü^2$ and *L2* and *R2* are the inductance and resistance respectively of the transistor and the leakage inductance and capacitance of the circuit which form a parallel resonant circuit having a resonant frequency of *W2*.

9. An amplifier in accordance with claim 8 wherein a plurality of amplifier stages and regulation stages are provided in series and wherein in the application of a stepwise regulation, the regulating stages which lie closest to the input of the amplifier are controlled first from maximum amplification of the amplifier to approximately zero then in the same manner the successive regulating stages are controlled up to maximum amplification.

* * * * *